US006170075B1

(12) United States Patent
Schuster et al.

(10) Patent No.: US 6,170,075 B1
(45) Date of Patent: Jan. 2, 2001

(54) DATA AND REAL-TIME MEDIA COMMUNICATION OVER A LOSSY NETWORK

(75) Inventors: Guido M. Schuster, Des Plaines; Jerry Mahler, Prospect Heights; Ikhlaq Sidhu, Buffalo Grove; Michael Borella, Naperville, all of IL (US)

(73) Assignee: 3Com Corporation, Santa Clara, CA (US)

( * ) Notice: Under 35 U.S.C. 154(b), the term of this patent shall be extended for 0 days.

(21) Appl. No.: 08/993,505

(22) Filed: Dec. 18, 1997

(51) Int. Cl.[7] .................................................. H03M 13/00
(52) U.S. Cl. ............................................................. 714/776
(58) Field of Search .................................... 370/389, 395; 714/776, 781, 807, 704, 752, 774, 761; 348/845.2

(56) References Cited

U.S. PATENT DOCUMENTS

| 5,115,436 | 5/1992 | McAuley | 714/781 |
|---|---|---|---|
| 5,428,629 | 6/1995 | Gutman et al. | 714/758 |
| 5,563,887 | 10/1996 | Harasaki | 714/756 |
| 5,583,562 | 12/1996 | Birch et al. | 348/12 |
| 5,600,663 | 2/1997 | Ayanoglu et al. | 714/774 |
| 5,608,738 | 3/1997 | Matsushita | 714/752 |
| 5,617,541 | 4/1997 | Albanese et al. | 709/207 |
| 5,699,369 | 12/1997 | Guha | 714/774 |
| 5,703,887 | 12/1997 | Heegard et al. | 714/775 |
| 5,757,416 | 5/1998 | Birch et al. | 348/6 |
| 5,828,788 | 10/1998 | Chiang et al. | 382/239 |
| 5,831,690 | 11/1998 | Lyons et al. | 348/845.2 |
| 5,870,412 * | 5/2000 | Schuster et al. | 714/752 |
| 5,903,574 * | 5/1999 | Lyons | 714/704 |
| 5,983,388 | 11/1999 | Friedman et al. | 714/776 |
| 5,993,056 | 11/1999 | Vaman et al. | 714/776 |
| 6,014,767 * | 1/2000 | Glaise | 714/776 |
| 6,038,694 * | 3/2000 | Swallow | 714/781 |
| 6,044,107 * | 3/2000 | Gatherer et al. | 375/222 |
| 6,061,820 | 5/2000 | Nakakita et al. | 714/751 |
| 6,064,673 * | 5/2000 | Anderson et al. | 370/389 |

FOREIGN PATENT DOCUMENTS

WO 97/38549    10/1997   (WO) .

OTHER PUBLICATIONS

McAuley, Anthony J., "Reliable Broadband Communication Using A Burst Erasure Correcting Code", Bellcore Computer Communication Research Group (1990), pp. 297–306.

Nonnenmacher, Jorg et al., "Parity–Based Loss Recovery for Reliable Multicast Transmission" (1997), pp. 289–300.

Lewis et al. Transmission of MPEG–2 Video Stream over ATM, IEEE, pp. 237–241, Jun. 1997.*

McCanne et al., Joint Source/Channel Coding for Multicast Packet Video, IEEE, pp. 25–28, Sep. 1995.*

Damodaram et al., Error Cetection & Correction Options for Data Services in B–IDSN, IEEE, pp. 1751–1757, Apr. 1990.*

Dravida et al., Error Performance of IEEE 802.6 Metropolitan Area Networks, IEEE, pp. 105–115, May 1990.*

(List continued on next page.)

*Primary Examiner*—Albert De Cady
*Assistant Examiner*—Shelly A Chase
(74) *Attorney, Agent, or Firm*—McDonnell Boehnen Hulbert & Berghoff

(57) ABSTRACT

A method and apparatus for improving the speed and quality of end-to-end data or real-time media transmissions over an internet is disclosed. A media stream being transmitted to the internet is channel coded at the edge of the internet in order to free upstream bit rate for use in source coding the media. The channel coded media stream may then be decoded at a remote edge of the internet to recover lost packets.

57 Claims, 3 Drawing Sheets

OTHER PUBLICATIONS

Smith Micro Software, Inc., "Media–independent Error Correction using RTP draft–budge–media–error–correction–00.txt", Audio–Video Transport Working Group, Internet–Draft, pp. 1–17 (May 1997).

Sherman, Ken, "Packet Switching", Data Communications (1990), chapter 17, pp. 384–407.

Shacham, N. et al., "Packet Recovery in High–Speed Networks Using Coding and Buffer Management", Information and Telecommunication Sciences Center SRI Int'l, INFOCOM 1990 Conference Publication.

Feher, Kamilo, "Wireless Digital Communications: Modulation and Spread Spectrum Applications", chapter 5, pp. 254–284 (1995).

Shacham, N., "Packet Recovery and Error Correction in High–Speed Wide–Area Networks", SRI International, INFOCOM 1989 Conference Publication, pp. 0551–0557.

Kalathur, R. et al., "Forward Error Correction with Buffer Management in Multimedia ATM Networks", Southcon/94 Conference Record, pp. 437–444 (1994).

Aghadavoodi Jolfaei, M. et al., "Improved Selective Repeat ARQ Schemes for Data Communication", Proccedings of Vehicular Technology Conference, pp. 1407–1411 (Jun. 8, 1994).

Bolot, J. et al., "Adaptive Error Control for Packet Video in the Internet", Proceedings of IEEE International Conference on Image Processing (Sep. 1996).

ITU Telecommunication Standardization Sector "Draft New Recommendation T.38 (T.Ifax2): Procedures for Real Time Group 3 Facsimile Communication Between Terminals Using IP Networks," Study group 8—Contribution 50, Feb. 1998.

International Search Report for Application No. PCT/US98/26421, dated Jul. 7, 1999.

* cited by examiner

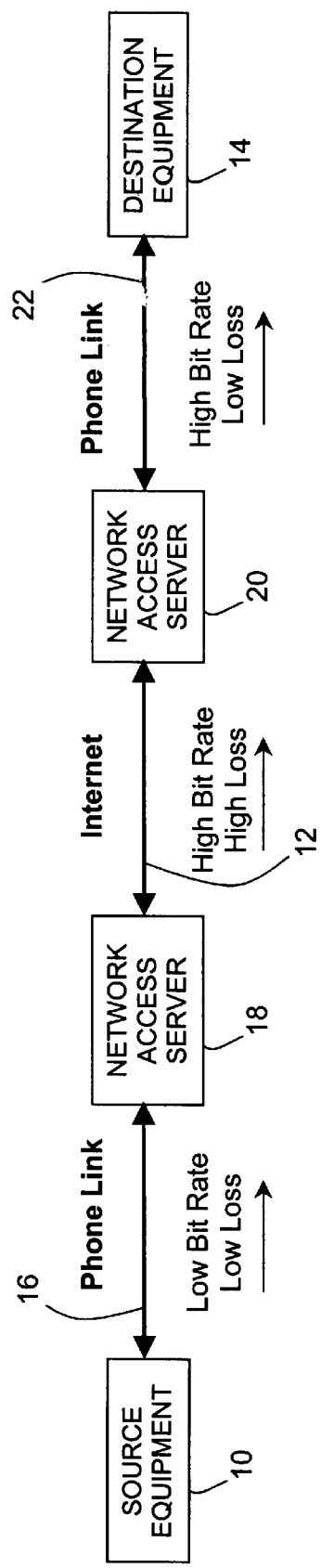

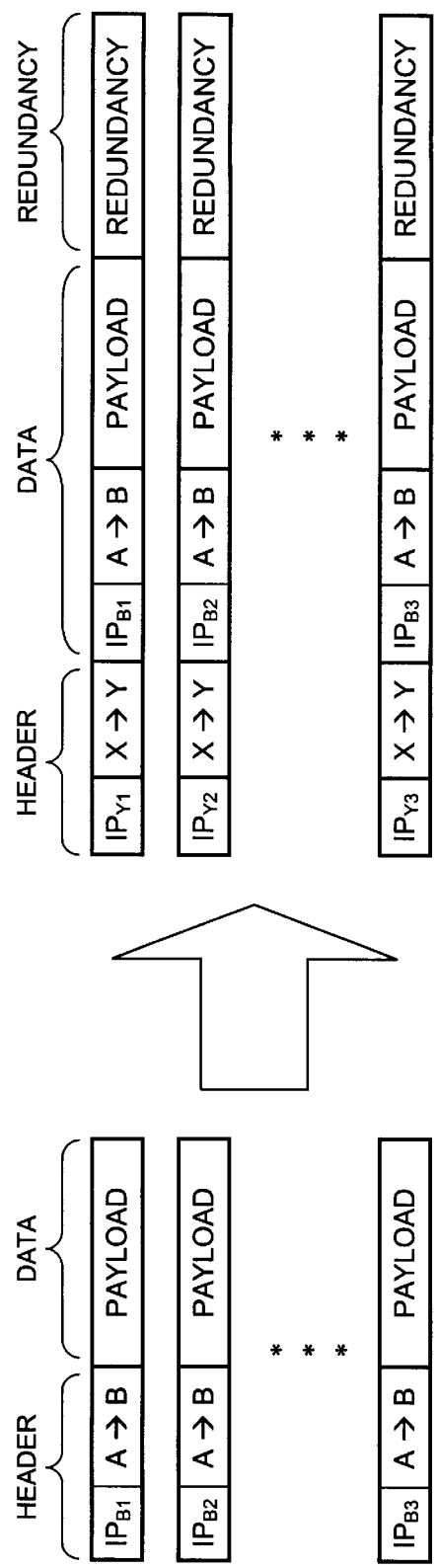

DATA AND REAL-TIME MEDIA COMMUNICATION OVER A LOSSY NETWORK

BACKGROUND OF THE INVENTION

1. Field of the Invention

The present invention relates to telecommunications systems and more particularly to a method and apparatus for improving the speed and quality of data communications through a packet switched network. The invention is particularly useful for enhancing the communication of real-time media signals, such as audio and video, through a congested and lossy network such as the Internet.

2. Description of the Related Art

The Internet is a world-wide network of computers and computer networks of a configuration well known to those in the art. The Internet operates according to a set of standard protocols known as Transmission Control Protocol/Internet Protocol (TCP/IP). Each protocol in the TCP/IP suite is designed to establish communication between common layers on two machines, or hosts, in the network. The lowest layer in the Internet is the "physical" layer, which is concerned with ensuring that actual bits and bytes of information pass along physical links between nodes of the network. The next layer is the "network" or "IP" layer, which is concerned with permitting hosts to inject packets of data into the network to be routed independently to a specified destination. The next layer in turn is the "transport" layer, which is concerned with allowing peer entities on source and destination hosts to carry on a conversation. Generally speaking, the IP and transport layers of the Internet are not concerned with the physical arrangement of the network, such as whether source and destination machines are on the same sub-network or whether there are other sub-networks between them.

The transport layer of TCP/IP includes two end-to-end protocols, TCP (Transmission Control Protocol) and UDP (User Datagram Protocol). TCP is a reliable connection-oriented protocol, which includes intelligence necessary to confirm successful transmission between the sending and receiving ends in the network. UDP, in contrast, is an unreliable connectionless protocol, which facilitates sending and receiving of packets but does not include any intelligence to establish that a packet successfully reached its destination. In general, UDP is used by applications that do not want TCP's sequencing or flow control and wish to provide their own.

According to the TCP/IP model, the TCP transport layer takes a data stream to be transmitted and breaks it up into independent connectionless segments or "datagrams." TCP adds to each of these packages a 20 byte header, which includes overhead information such as a source port number, a destination port number and a sequence number designed to allow the receiving end to properly reassemble the datagrams into the original message. The transport layer then "passes" each of these packages to the IP layer.

The IP layer in turn adds another header to each package, providing additional overhead information, such as a source IP address and a destination IP address. The IP layer then transmits the resulting packages through the Internet, possibly fragmenting each package into pieces or as it goes. As the pieces of the package finally reach the destination machine, they are reassembled by the IP layer and passed to the transport layer. The transport layer then inserts the original datagrams in proper sequence in an effort to reconstruct the original data stream for use by the receiving process and ultimately by an end user.

As a computer network, the Internet thus serves to provide communication between two nodes, such as a local subscriber computer/modem (which may be referred to as the "source" equipment) and a remote computer/modem (which may be referred to as the "destination" equipment), for example. In practice, the source equipment packetizes a stream of useful data and adds to each packet the header information required by TCP/IP for transmission over the Internet. The source then forwards a sequence of these packets via a communications link to a network access server (often in the form of a "hub" or "router") at the edge of the Internet.

The communications link from the source equipment to the network access server may take any of a variety of forms. As an example, if the source equipment is a connected to the public switched telephone network (PSTN), the communications link may consist of an unshielded twisted pair (UTP) of copper wires extending from the subscriber's modem to a telephone company central office, and then a T1 line extending from the central office to the network access server. As another example, if the source equipment is connected to a local area network (LAN), the communications link may consist of the LAN and then a transmission line extending from the LAN to the network access server. In that case, the source equipment may even have its own Internet address (IP address). Nevertheless, the source equipment should still be viewed as being connected "to" the Internet via a communications link, as it is connected via that link to a network access server at the edge of the Internet. In any event, this communications link is generally reliable, in the sense that little if any perceptible loss will result to data being carried by the link.

At the edge of the Internet, the network access server receives the incoming stream of data packets provided by the source and routes the packets onto the Internet for transmission to a remote location, or other edge, of the Internet. This network access server is commonly owned by an Internet Service Provider (ISP) organization. Due to the growing demand for Internet access, a network access server usually contains a plurality of modems or other circuitry arranged to simultaneously receive and process multiple incoming calls. In addition, the network access server often includes or is connected to a gateway, sometimes in the form of a discrete processor, for forwarding the packets onto the Internet. Of course, the network access server may take other forms as well, generally serving the function of passing data between the Internet and some external communications link (even if that external communications link is an offshoot of the Internet).

Ideally, the packets transmitted into the Internet by the network access server should arrive successfully at a remote edge of the Internet and pass to the specified destination equipment. Generally, similar to the source equipment as described above, the destination equipment is connected via a communications link to a network access server at the remote edge of the Internet. This communication link may be of the same or different type than that used to connect the source equipment. In any event, the destination equipment should ideally receive the transmitted IP packets, extract the payload from the packets and reconstruct an ordered data stream for use by an remote subscriber.

Unfortunately, deficiencies in the existing communication infrastructure have precluded the successful widespread transmission of real time media signals, such as digitized voice, audio and video, from end-to-end over the Internet. The principle reasons for this lack of success have been a limited bit rate in the communications link and, to a greater degree, a high rate of packet loss and delay in the Internet.

First, the conventional telephone circuit often used to carry packets between the source equipment and the network access server is limited in bit rate. In particular, according to Shannon's Law, which is well known in the art, the bit rate or capacity C in a transmission line having a bandwidth B and a signal-to-noise ratio SNR is defined as the product of B and $\log_2(1+SNR)$. While the quality of transmission along a conventional telephone line may vary, the line typically has a bandwidth of about 3 kHz and a signal-to-noise ratio of about 30 dB. With these values, the line would be limited to a bit rate of about 30 kpbs.

In an effort to work with this bit rate limitation, the telecommunications industry has recognized that Internet users (and other modem users) are more likely to download complex media signals (such as audio and video clips) from the Internet than to upload such signals to the Internet. Consequently, many modems today apportion the available telephone line capacity between upstream communication (away from the subscriber modem) and downstream communication (toward the subscriber modem). These modems include, for example, the U.S. Robotics Sportster 56K Faxmodem, and the U.S. Robotics Sportster 56K Winmodem, both manufactured by 3Com Corporation, of Santa Clara, Calif.

Commonly, for instance, by employing advanced digital coding techniques, modems may allocate a bit rate of 56 kbps to downstream transmission and a bit rate of only 33.6 kbps to upstream transmission. Alternatively, other protocols such as ADSL (asymmetric digital subscriber line) provide for different bit rate allocations between the upstream and downstream channels in the telephone link.

Due to the limited bit rate available for upstream transmission on the conventional telephone link, real-time media services such as digitized voice and video need to be highly compressed or "source coded" in order to be transmitted to the Internet. As is known in the art, however, the more a media signal is compressed, the more distorted the signal will become. Therefore, provided with a limited upstream bit rate, the existing communication infrastructure will tend to distort real time media signals transmitted from a source modem to a destination modem.

Beyond these deficiencies in the telephone link, however, the Internet itself (generally extending from network access server to network access server) also suffers from a high rate of packet loss and resulting transmission delays. In particular, depending on conditions such as how congested the Internet is at any given time, loss of entire packets has been found to occur on the Internet at a rate of up to 25%, or up to one in every four packets. Typically, this packet loss occurs one packet at a time, which should not perceptibly distort a real-time audio signal, but may perceptibly distort a real-time video signal, and would certainly distort a pure data signal such as an e-mail message. Often, however, burst errors occur on the Internet and result in the loss of multiple sequential packets in a row. Unlike the sporadic loss of a single packet, if left uncorrected, these burst errors can and will substantially and perceptibly distort almost any transmitted signal.

The connection-oriented TCP protocol provides a mechanism for responding to packet loss in the Internet. According to TCP, when a segment arrives at the destination, the receiving TCP entity should send back to the sending entity a segment bearing an acknowledgement number equal to the next sequence number that it expects to receive. If the sending entity does not receive an acknowledgment within a specified time period, it will re-transmit the package of data.

Generally speaking, this acknowledgment and re-transmission system works well to correct packet loss in the Internet. However, the system can unfortunately delay the complete transmission of a data stream. For the transmission of packets representing pure data signals such as e-mail messages, transmission delay is not ideal, although it is of secondary concern compared to an unrecoverable loss of information. Real-time media signals, however, are by definition highly sensitive to delay and will appear jumpy, interrupted or otherwise distorted if parts of the signal do not flow continuously to the receiving end. Therefore, although the loss of packets in a real time media transmission over the Internet has been correctable, the resulting signals have often nevertheless been of unacceptable quality.

Still further, in addition to the standard packet loss correction mechanism provided by TCP, the source and destination equipment may employ other error correction mechanisms or protocols in an effort to manage packet loss and minimize distortion to real time media signals. As presently contemplated, these mechanisms may involve adding redundant information to the data stream in an effort to enable a receiving end to reconstruct lost data. This process is commonly employed in wireless communications and is referred to as "channel coding." One of the simplest examples of a channel coder is a repetition coder, which calls for sending duplicates of each packet as a redundant packet. In the event the "original" packet is then lost in transmission, the receiving end should theoretically still receive the redundant packet and thereby recover the lost payload.

Unfortunately, however, by adding redundant information to a data stream, channel coding necessarily requires a higher bit rate for transmission. In turn, provided with the limited total upstream bit rate described above, if more bits are to be allocated to channel coding, then fewer bits will be available for source coding, and the resulting real time media stream will need to be more compressed and therefore more distorted. Conversely, if more bits are allocated to source coding, then fewer bits will be available to channel code the signal, and packet loss in the Internet will be more likely to distort and delay the signal.

As the foregoing illustrates, the existing structure and methods for communication of data and real time media signals over the Internet have proved to be deficient. In view of the existing deficiencies, a need therefore exists for an improved mechanism to provide better quality and quicker end-to-end communications over the Internet or other lossy network.

SUMMARY OF THE INVENTION

The present invention is a method and apparatus for providing improved end-to-end transmission of data or real-time media signals through a lossy network such as the Internet. The invention stems from the realization that the upstream communications link to the network access server provides a highly reliable and low bit-rate channel (e.g., a conventional telephone circuit), while the bi-directional Internet link provides an unreliable and high bit-rate channel, and the remote downstream link to the destination modem also provides a highly reliable and high bit-rate channel. A signal passing from end-to-end in this configuration may therefore flow, in order, through the following three physical links:

(1) Low bit rate, highly reliable communications link;

(2) High bit rate, lossy Internet; and (3) High bit rate, highly reliable communications link.

Conveniently, from the point where this transmission path begins to be lossy (i.e., from the start of the "Internet,"

where packet loss begins to be likely), a high bit rate is available for transmission.

As described above, real time media streams are currently both source coded and channel coded in the source equipment. Source coding a real-time media stream serves to represent the stream with as few bits as possible, as for example by compressing and/or quantizing the data. Channel coding, in contrast, serves to add redundant information to the real-time media stream for use in reconstructing lost packets at the receiving end. Source coding thus decreases the size of the signal being transmitted, while channel coding increases the size of the signal being transmitted.

To improve performance in end-to-end real time media transmissions over the Internet, the present invention calls for channel coding the media stream at the edge of the Internet rather than at the source, thus conserving the limited bit rate in the upstream communications link. Given that the communications link to the edge of the Internet is a low bit rate, low loss channel (in the case of the PSTN, for instance), all of the available modem bit rate can beneficially be used for source coding, thereby requiring less compression and leading to less distortion. As a result, the source coded stream can be sent to the network access server without any channel coding. At the network access server, the source coded stream may then be channel coded as necessary for transmission through the lossy Internet, adding redundant information and taking advantage of the higher bit rate available in the Internet. In turn, any necessary channel decoding may be done at a remote network access server, at the destination or at some other remote location.

Provided with the present invention, experimental simulations have shown that when a real-time media stream is transmitted end-to-end over the Internet at even a low bit rate of 28 kbps and with a 25% rate of packet loss, the resulting media signal can look and/or sound very good. Further, in experimental simulations, the present invention has been shown to double browsing speed on the World Wide Web interface of the Internet.

These as well as other advantages of the present invention will become apparent to those of ordinary skill in the art by reading the following detailed description, with appropriate reference to the accompanying drawings.

BRIEF DESCRIPTION OF THE DRAWINGS

Preferred embodiments of the present invention are described herein with reference to the drawings, in which:

FIG. 1 is a block diagram illustrating an example of a configuration in which the present invention may be implemented;

FIG. 2 is a table indicating the capacity and reliability of various physical links in the example configuration shown in FIG. 1;

FIG. 5 is a flow table tracking the flow of packets from a specified source to a specified destination according to an embodiment of the present invention; and FIG. 6 is a data flow diagram depicting new IP packets created by a network access server in accordance with a preferred embodiment of the present invention.

DETAILED DESCRIPTION OF THE PREFERRED AND ALTERNATIVE EMBODIMENTS

Figure 3:
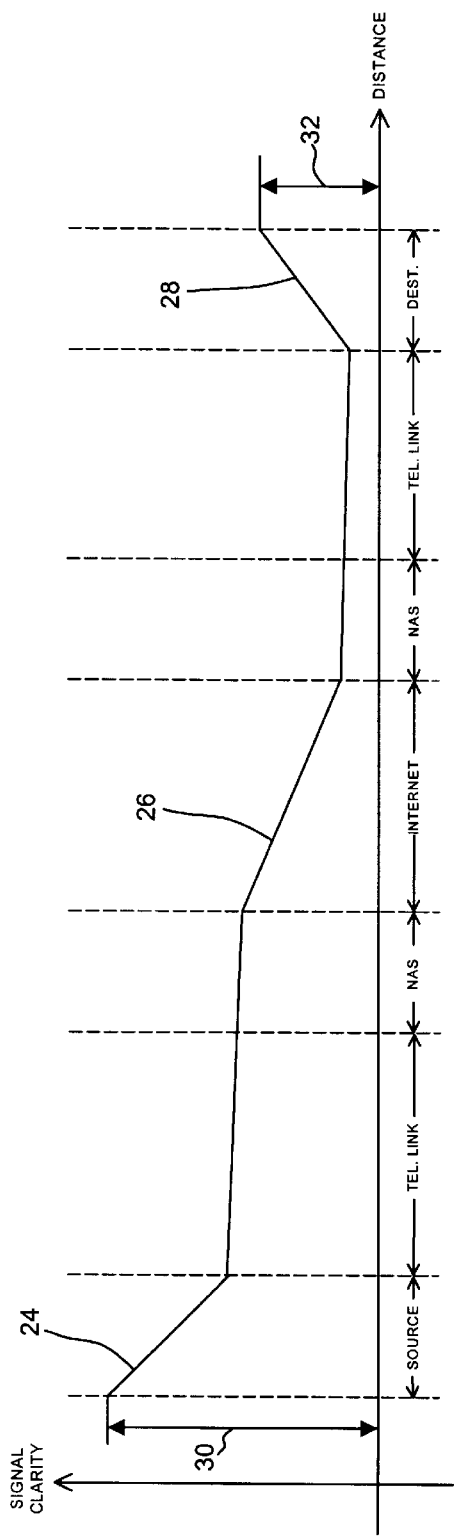
FIG. 3 is a graph depicting in theory the clarity of a real-time media signal transmitted along the configuration shown in FIG. 1 according to the prior art.

Referring to FIG. 1, the present invention may be implemented in a communication system in which source equipment 10 wishes to establish end-to-end communication of data over an internet 12 with destination equipment 14. Internet 12 is preferably a packet switched wide area network (WAN) or a combination of large computer networks joined together over high-speed data links. An example of one such computer network is the "Internet" (capital "I"), which is described in the above background section. However, internet 12 may equally be another wide or local area network.

As illustrated by FIG. 1, in one example configuration, internet 12 provides a high bit rate, high loss transmission channel. For instance, internet 12 may be assumed to provide a bit rate of 56 kbps in any direction. In addition, for purposes of this example, internet 12 may be assumed to suffer from a packet loss rate of up to 25% when congested.

Typically, source equipment 10 includes a personal computer that generates digital data and transmits the data to a modem, which in turn modulates the data for transmission. However, source 10 may alternatively be some other device capable of sending and/or receiving data signals. In one common configuration, for instance, source equipment 10 may be device (such as a server or a personal computer or other terminal, for example) that sits on a local area network (LAN) interconnected to internet 12. Still alternatively or additionally, source equipment 10 may be any device that has a network address within internet 12. Destination equipment 14 also typically includes a modem and computer. However, destination equipment 14 as well may alternatively be some other communication device, such as a device that sits on a LAN and/or has an address within internet 12.

Source and destination equipment 12, 14 may alternatively be referred to, respectively, by terms such as a local user device and a remote user device, or a first user device and a second user device. Alternatively, from the perspective of internet 12, the source or destination equipment may be viewed simply as remote terminals.

Source equipment 10 is interconnected to a network access server 18 at the edge of internet 12 via a communications link. As described in the above background section, the communications link may take any of a variety of forms including, for example, a telephone circuit or a computer network. For purposes of the present description, and without limitation, the communications link will be assumed to be a conventional telephone circuit or telephone link 16. In a common configuration as noted above, however, the communications link may alternatively be a LAN or other network interconnected via a transmission line to the edge of internet 12. Still more generally, the communications link may be any wired or wireless communications path including, for example, copper wire, fiber optic, T1, ISDN, cellular, microwave or satellite links.

Telephone circuit 16 provides bi-directional communication between source 10 and network access server 18. For reference in this description, communication of data in the direction from source 10 to network access server 18 will be referred to as "upstream," because the source is sending data "up" to the network. Similarly, communication of data from network access server 18 to source 10 will be referred to as "downstream," because data is flowing "down" to the source from the network. It will be appreciated, however, that these references may change depending on the perspective of an observer.

For reasons discussed above, telephone circuit 16 typically provides highly reliable (low loss) asymmetric communication channels, with a low bit rate allocated to the upstream transmission channel and a high bit rate allocated to the downstream transmission channel. For purposes of example in this description, the upstream channel provided by telephone circuit 16 may be assumed to be limited to 33.6 kbps and the downstream channel may be assumed to be limited to 56 kbps. It should be appreciated, however, that the invention is not restricted to use in connection with this or other asymmetric channel allocations but may even extend to use in connection with a symmetric telephone circuit 16. In that case, for purposes of example in this description, telephone circuit 16 could be assumed to provide a low bit rate of 33.6 kbps in each direction.

Network access server 18 provides connectivity between internet 12 and source 10 via telephone link 16. Network access server 18 preferably includes a line interface circuit that operates to connect the network access server to telephone circuit 16 and a network interface circuit that operates to connect the network access server to internet 12. Additionally, network access server 18 typically includes one or more modems and/or computer processors, together with memory, interconnected via a bus with the line interface and configured to process data that flows between link 16 and internet 12.

An example of a network access server suitable for use in the present invention is described in U.S. Pat. No. 5,528,595 (Walsh et al.), which is entitled "Modem Input/Output Signal Processing Techniques," and which issued on Jun. 18, 1996 to U.S. Robotics, Inc. Such a device has been commercialized widely by 3Com Corporation (previously U.S. Robotics Corp.) under the designation Total Control™ Enterprise Network Hub. Network access servers similar in functionality, architecture and design are also available from other companies, including Ascend Communications, Livingston Enterprises, Multitech, and others. The present invention is suitable for implementation, at least in part, in network access servers from these companies.

Typically, destination equipment 14 is also interconnected to a network access server 20 at some remote edge of internet 12 via a communications link. Like the link extending between source equipment 10 and network access server 18, this communications link may take any of a variety of forms such as those described above. For purposes of example in this description, however, and without limitation, the communications link will be assumed to be a conventional telephone circuit 22. Similarly, network access server 20 may, for example, be similar in configuration to network access server 18.

From the foregoing, it is evident in this example that a signal flowing from source 10 to destination 14 will pass through three physical links: (i) the upstream channel of telephone circuit 16, (ii) the internet 12 and (iii) the downstream channel of telephone circuit 22. These three links are summarized by a table set forth in FIG. 2. In terms of bit rate, the signal first passes through a low bit rate link (the upstream telephone circuit) and then, upon reaching the internet 12, passes through one or two high bit rate links (the internet and possibly the downstream telephone circuit). In terms of packet loss, the signal first passes through a highly reliable link (the upstream telephone circuit), then through an unreliable link (the internet), and then possibly through another highly reliable link (the downstream telephone circuit).

The preferred embodiment of the present invention is concerned with the transmission of real-time media signals through the existing communication infrastructure. Generally speaking, real-time media signals may be digitized and may fall into two categories, audio and video. Examples of audio signals include music and voice. Examples of video signals include still and moving images as well as other graphics. Of course, the present invention is not limited to use in connection with the transmission of these specific types of signals but equally extends to the transmission of other signals as well, such as pure data signals (e.g., e-mail messages).

As real-time media signals pass through the existing transmission system, they become degraded due to bit rate limitations and packet loss. In particular, as described in the above background section, a real-time media signal must be source coded (compressed and/or quantized) to fit within the available bit rate, which necessarily distorts the signal to some extent. Additionally, internet 12 (and particularly the Internet, for example) suffers from a high rate of packet loss of up to 25%, especially during times of congestion, and channel coding the signal to help recover from this packet loss adds additional distortion (such as delay) to the real-time signal.

FIG. 3 illustrates the stages through which a real-time media signal passes in the existing infrastructure and graphically depicts in theory how clear the signal would be at each stage. As shown in FIG. 3 and as described above, the signal passes through source 10, telephone link 16, network access server 18, internet 12, network access server 20, telephone link 22, and destination equipment 14. Of these stages, source 10, internet 12 and destination 14 have been particularly significant.

In the existing system, the source coding and channel coding functions have both been performed by source 10. As described above, source coding serves to compress the media signal for transmission through with the limited bit rate of upstream telephone link 16. Source coding provides a good quality signal with low compression but a poor quality signal with high compression. Channel coding, in contrast, serves to add redundant information to the signal to enable the receiving end to recover packet loss that is likely to occur in internet 12.

Since channel coding adds redundant data to the bit stream, and only a limited upstream bit rate is available to carry the resulting signal, fewer bits are available to use for source coding. Consequently, source 10 needs to compress the media stream to a greater extent, which in turn increases signal distortion. As a result, as illustrated by phase 24 in FIG. 3, the media signal (represented by a sequence of packets) is already significantly distorted when it leaves source 10.

As the packets representing the media stream arrive at network access server 18, they are routed into internet 12. The packets should then ideally travel through internet 12 and arrive at remote network access server 20. However, due to the high rate of packet loss in internet 12, many packets become lost and never arrive at network access server 20. Left uncorrected, this packet loss would further distort the media signal (which is then represented by the remaining packets), as shown by phase 26 in FIG. 3.

After exiting remote network access server 20, the packets may travel along telephone link 22 and arrive at destination equipment 14. In the existing system, destination equipment 14 would then channel decode the data stream, attempting to recover lost packets, using the redundant information provided by source 10. As a result, the distortion that would have occurred from packet loss in internet 12 is largely reversed, except for delay occasioned by the channel decoding process. This reversal, or improvement in signal clarity, is illustrated by phase 28 in FIG. 3.

Once the packet stream has been channel decoded, destination equipment 14 extracts the payload from the resulting packets and reconstructs the original source coded media signal to the extent possible. Destination equipment 14 then source decodes the bit stream, attempting to decompress the signal. It is generally understood, however, distortion caused by the extensive signal compression (source coding) in source 10 will in large part be uncorrectable. Therefore, the media signal that destination equipment 14 ultimately provides to a user is of substantially lower clarity than the signal initially provided by source 10, as illustrated by comparison of heights 30, 32 in FIG. 3.

The present invention greatly improves over the foregoing existing transmission system by recognizing that, while source coding is optimally performed by source 10, channel coding does not need to be performed by source 10 but can more efficiently be performed at the edge of internet 12 by network access server 18.

As noted above, source coding results in media streams with good quality at less compression. However, because source coding by definition packs a lot of information into each packet, the packets defined by the resulting media stream are very sensitive to packet loss as may be caused by burst errors or other problems in the transmission path. In turn, the delay that arises from having to retransmit lost packets can be more detrimental to the quality of the media signal.

Since the first physical link in the transmission path (upstream telephone circuit 16) is low in loss, there is little if any chance of packet loss before the media stream reaches internet 12. Therefore, the source coded media stream can conveniently be sent to network access server 18 without any channel coding. In turn, by eliminating (or avoiding the necessity of) the channel coding function from source 10, the entire upstream bit rate becomes available for source coding, and, as a consequence, the media stream can be source coded with less compression, to thereby provide a much better quality signal for transmission to internet 12.

Instead of channel coding the media stream at source 10, the present invention contemplates channel coding the stream just before it enters the lossy internet 12. In the preferred embodiment, this function may be performed at network access server 18. Channel coding the media stream at that point will increase the bit rate required for transmission of the media stream. However, internet 12 is presumed to operate at sufficient bit rate to carry the additional information. Further, channel coding the media stream will enable robust recovery from packet loss that occurs in lossy internet 12.

In the preferred embodiment, as media packets pass through the internet 12 and arrive at remote network access server 20, network access server 20 performs channel decoding. In doing so, network access server 20 recovers lost packets to the extent possible, using the redundant information added through channel coding by network access server 18, and reduces the media stream substantially back to its original (source coded) size. Network access server 20 then passes the media stream over telephone link 22 to destination equipment 14.

Advantageously, the scheme contemplated by the present invention thus enables the source and channel coding functions to be performed at different places in the network, each optimal for its purpose. Source 10 is the optimal location to source code the media stream at a low bit rate, for transmission along the reliable but low bit rate phone link 16. Network access server 18, in turn, is the optimal location to channel code the media stream for transmission through the lossy but high bit rate internet 12.

With this arrangement, experimental simulations have shown that the resulting media stream can look very good, even with transmission through a 28 kbps bit rate internet suffering from 25% packet loss. Additionally, experimental simulations have established that the improvement of the present invention may increase the speed of browsing or "surfing" on the World Wide Web interface of the Internet by a factor of two.

Figure 4:
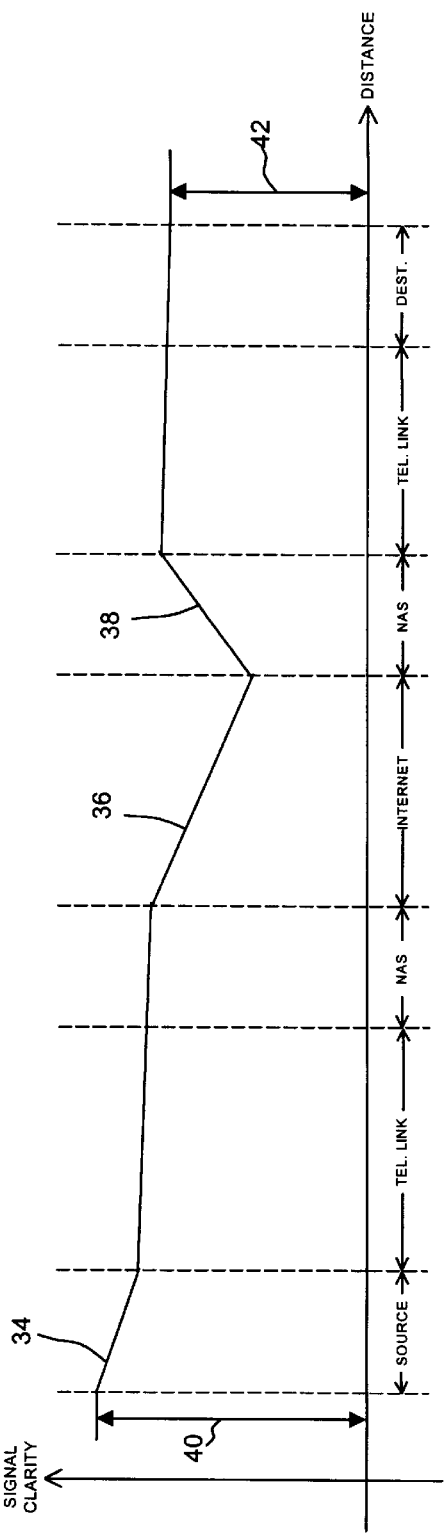
FIG. 4 is a graph depicting in theory the improved clarity of a real-time media signal transmitted along the configuration shown in FIG. 1, according to a preferred embodiment of the present invention.

To help explain why the present invention improves over the prior art, FIG. 4 generally illustrates the phases of signal clarity (or lack of distortion) through which a real-time media signal should pass according to the preferred embodiment of the present invention.

Referring to FIG. 4, source 10 may source code the media stream at a relatively high data rate, for transmission using the full available bit rate in upstream telephone link 16. Because source 10 does not have to compress the media stream as much as it would if it also channel coded the stream, the distortion to the signal is less. This distortion is illustrated by phase 34 in FIG. 4, as compared to greater distortion shown by phase 24 in FIG. 3.

In the preferred embodiment, once the packets representing the media stream arrive at network access server 18, network access server 18 channel codes the packets and sends the resulting packets into internet 12. Due to the high packet loss rate in internet 12, many of these packets become lost and never arrive at remote network access server 20. The signal distortion that would be caused by this packet loss, absent subsequent correction, is illustrated by phase 36 in FIG. 4.

According to the invention, as the packets then arrive at the remote edge of internet 12, remote network access server 20 may channel decode the media stream, replacing any lost packets to the extent possible given the available redundancy information provided by channel coding at network access server 18. Absent very extreme packet loss, this channel decoding process will recover most of the packets that define the source coded media stream, substantially eliminating the effect packet loss, as shown in turn by phase 38 in FIG. 4.

In some configurations, the packets exiting network access server 20 would next travel along telephone link 22 to destination equipment 14. Destination equipment 14 would receive these packets, extract the payload and reconstruct a source coded data stream substantially the same as that transmitted by source 10. Finally, destination equipment 14 would source decode the data stream and recover essentially the same signal as initially provided by source 10. Disregarding miscellaneous line noise and unrecoverable packet loss errors, the media signal that destination equipment 14 ultimately provides to a user is diminished in clarity only to the extent caused by the minimized source coding in source 10. Thus, a comparison of the input and output signal clarity levels is shown by heights 40, 42 in FIG. 4, contrasted with the comparison of heights 30, 32 in FIG. 3.

Because network access servers 18, 20 are each nodes on internet 12, it would be beneficial to establish communication between them so that network access server 18 knows when to channel code an incoming signal and remote network access server 20 knows when to channel decode the signal. Absent such communication, network access server 18 could waste computational resources by channel coding a packet stream that may not be decoded by a remote line element. Alternatively, absent such communication, remote network access server 20 could attempt to channel decode all incoming streams (rather than only the channel coded data from network access server 18), which would also waste computational power.

According to another aspect of the invention, therefore, a mechanism is provided for establishing communication between network access servers 18, 20 and allowing them to agree to channel code and decode when necessary. For purposes of describing this aspect, internet 12 will be assumed to be operating according to the TCP/IP model. However, it will be understood that the mechanism for establishing communication between the network access servers, if necessary at all, can be adapted by those skilled in the art to work within other network transmission protocols as well.

According to this aspect of the invention, network access server 18 continuously monitors the source and destination IP addresses that are indicated in incoming IP packets. Based on this monitoring, network access server 18 maintains a flow table in memory, by which network access server 18 tracks the number of packets that originated with a given source and were targeted for a given destination. FIG. 5 depicts an example of one such table, where source and destination equipment 10, 14 have illustratively been designated by letters and where, for instance, 31 packets have been transmitted from source A to destination B, and 5 packets have been transmitted from source R to destination L.

Once network access server 18 counts more than some predetermined number of packets flowing from a given source to a given destination, network access server 18 will conclude that the source and destination are communicating. This may be referred to as a "real flow" between the source and destination. On the other hand, if less than some predetermined number of packets flows from a given source to a given destination in, say, a specified time period, then network access server 18 may delete the entry from the flow table. Thus, referring to the table in FIG. 5, for instance, network access server 18 may conclude that a real flow exists between A and B, because more than 30 packets have passed between A and B. In contrast, network access server 18 may decide to delete the listing for packets from R to L, because only 5 such packets have passed through network access server 18 within a specified time period.

Once network access server 18 detects a real flow between a source 10 and destination 14, network access server 18 should advise network access server 20 that it is prepared to begin channel coding data in that real flow. To do so, network access server 18 may send a special IP packet toward destination 14, placing in the special IP packet some predetermined port number to which destination equipment 14 would normally not respond. Alternatively, network access server 18 may place in the special IP packet some other predetermined symbol to which destination equipment 14 would normally not respond.

Remote network access server 20 is in turn configured to check the port number and (as usual) the destination address of incoming IP packets. If network access server 20 sees the predetermined port number, and provided that the destination address is a client of network access server 20, then network access server knows that the special IP packet is actually meant for it rather than for destination equipment 14. Network access server 20 therefore does not pass the special IP packet along to destination 14 but, instead, may send a predetermined acknowledgement to network access server 18.

Through this process, network access servers 18, 20 at the edge of internet 12 may thus establish a communication with each other and can proceed to channel code and decode the media stream if they wish. In this regard, it is worth noting that an internet operating according to the TCP/IP model generally does not provide for this type of intelligent communication between two intermediate line elements such as network access servers 18, 20, since such intermediate line elements are meant merely to pass data along to a designated IP address rather than to be concerned with physical network arrangements. This aspect of the invention thus further improves over the existing art.

In the preferred embodiment, once network access servers 18, 20 have established communication with each other, they may observe internet 12 to determine how much packet loss is presently occurring. The network access servers may do this in any of a variety of ways. A simple method would be to have the receiving network access server monitor sequence numbers of arriving packets and thereby approximate how many packets are lost in transmission. If the packet loss rate is sufficiently high at a designated moment, network access servers 18, 20 will agree to begin channel coding and decoding the packet stream in the real flow between A and B.

In general, as described above, channel coding a packet stream typically means that redundant information indicative of the payload in a packet stream is added to the packet stream to enable subsequent recovery from packet loss. This redundant information may be derived and added to the packet stream in any of a number of ways, and the present invention is not necessarily limited to use of a specific channel coding scheme. For purposes of example, however, three possible channel coding schemes are (i) repetition block coding, (ii) XOR block coding, and (iii) Reed-Solomon block coding.

Repetition block coding is perhaps the simplest possible scheme, as described generally in the above background section. According to this scheme, network access server 18 would make a copy of each incoming packet and send both the original and the copy of the packet into internet 12. In this way, if the original is lost, network access server 20 may nevertheless receive the copy. This scheme may be enhanced to be more robust to burst errors by having network access server 18 interleave the originals and copies. For example, instead of sending the packet stream 1, 1, 2, 2, 3, 3, 4, 4, network access server 18 could send the packet stream 1, 2, 3, 4, 1, 2, 3,4.

Further, this repetition scheme can be additionally enhanced to work best within the present invention by copying the incoming packets a number of times proportionate to the available bit rate of internet 12 compared to the upstream bit rate of telephone link 16. Thus, for instance, if the upstream bit rate of telephone link 16 is half the bit rate of internet 12, each packet can be copied once (to provide an original and one copy). If, however, the upstream bit rate of telephone link 16 is one third the bit rate of internet 12, then each packet can be copied twice (to provide an original and two copies). In this way, the invention can take full advantage of the additional bit rate available in internet 12.

One of the benefits of the repetition block coding scheme is that it is fully compatible with almost any multimedia standard used to communicate these packets, such as, for instance, H.323 or G.723.1. In addition, making copies of packets requires only a minimal amount of work by network access server 18. Therefore, processing power can be conserved.

The other two example channel coding schemes, an XOR coder and a Reed-Solomon coder, are described respectively in two U.S. patent applications filed by the present inventors on Dec. 12, 1997. These applications are both entitled "A Forward Error Correction System for Packet Based Real Time Media," and each of these applications is expressly incorporated herein by reference. Generally speaking, an XOR coding scheme may call for continuously appending to each of a series of packets a single forward error correction code that is defined by taking the XOR sum of a preceding specified number of payload blocks. A Reed-Solomon coding scheme, in contrast, may call for deriving p redundancy blocks from each group of k packets using a Reed-Solomon block coder, and appending those p redundancy blocks respectively to various packets in the next group of k packets. For a more detailed discussion of these channel coding schemes, the reader is directed to the documents incorporated by reference.

Once network access server 18 derives the necessary redundant information, it must provide this information in some way to network access server 20. At the same time, however, there is no need to provide this redundancy information to destination equipment 14. To achieve this arrangement in a preferred embodiment of the present invention, network access server 18 may derive and send to network access server 20 a series of new IP packets in response to the incoming packets that define the real flow between A and B. Each of these new packets may include the respective incoming packet as well as any redundancy information, to the extent called for by the selected channel coder.

FIG. 6 illustrates in general how a series of packets in the real flow from A to B would be coded in this way for receipt by network interface unit 20. For reference in these figures, network access servers 18, 20 are referred to, respectively, as having IP addresses X and Y. As shown by way of example in FIG. 6, an IP packet in the real flow that arrives at network access server 18 contains (i) a header designating the source and destination respectively as A and B and (ii) a block of payload data. For reference, this packet may be referred to as $IP_{B1}$. Network access server 18 receives this packet and responsively generates a new IP packet destined for network access server 20 at IP address Y. This new IP packet, which may be referred to as $IP_{Y1}$, contains (i) a header designating the source and destination respectively as X and Y, (ii) a data block consisting of $IP_{B1}$, and (iii) a redundancy block to the extent necessary given the selected channel coder. Network access server 18 in turn continues this process for each subsequent IP packet in the real flow from A to B.

Alternatively, rather than appending redundancy information to existing payload, network access server 18 may generate transmit independent parity packets that contain the necessary redundancy information. A benefit of sending redundancy information in separate packets rather than combining it with incoming payload is that packet size can remain consistent. On the other hand, increasing the number of packets by generating separate parity packets also increases the burden on network routers.

In any event, because these new packets are destined for network access server 20, the packets should generally arrive at network access server 20. There, network access server 20 preferably strips the header and redundancy information (if any) added by network access server 18 and passes the original packet ($IP_{B1}$) along telephone link 22 to destination equipment 14. In the preferred embodiment, and depending on the selected channel coder, network access server 20 will also store the redundancy information and the payload data in memory for use in channel decoding and thereby recovering lost packets to the extent necessary.

In an alternative embodiment of the present invention, channel decoding may be performed at destination equipment 14 rather than at network access server 20. This alternative embodiment works especially well with the simple repetition block coder described above. Using such a scheme, network access server 18 may, for instance, send an original and one copy of each incoming packet. In the event the original is lost in internet 12, the copy may still arrive successfully at destination 14. Alternatively, if destination 14 has already received the original and then receives the copy, destination 14 may disregard the copy. Of course, the present invention may also work equally well with even more complex channel decoding performed at destination 14. At present, however, many existing subscriber modems (or other destination equipment) would need to be reprogrammed or otherwise retrofit to perform such functions.

In another alternative embodiment, the functions described above as being performed by network access server 18 may instead be performed at another point. For instance, in the arrangement where source equipment 10 sits on a computer network (such as a LAN or WAN) that is in turn interconnected via a high capacity transmission line to network access server 18, these functions may be performed by a device (such as a server) on the network or transmission line. Typically, a LAN operates with a low loss rate and a high bit rate (contrasted with telephone link 16, for instance, which operates with a low loss rate and a low bit rate). Therefore, a LAN has the capacity to carry extra redundancy information generated in accordance with the present invention, for use in recovering from packet loss in internet 12. In turn, network access server 20 (or destination equipment 14) may source decode the signal as specified above.

The methods described above may be carried out by either programmable or dedicated hardware, software, or firmware in the respective transmission line elements. Provided with the present description, those of ordinary skill in the art will be able to design the necessary hardware or software enhancements without undue experimentation.

For instance, in order for network access server 18 to channel code a packet stream, a set of machine language instructions may be loaded into a memory or other storage device in the network access server and executed by one or more computer processors in the device. Such processors may be located, for instance, in modems and/or a gateway card in the network access server. Alternatively, the channel coding function may be encoded in a dedicated or programmable digital signal processing chip or other circuitry. Additionally, in the event an existing network access server is programmable, the functionality of the present invention may be added conveniently by reprogramming the device.

Of course, appropriate hardware or software configurations may also be established in remote network access server 20 and/or destination equipment 14. Further, in order to render the present invention most effective, the channel coding function presently being performed by source equipment 14 should be removed from the source equipment. In the event source equipment 14 is programmable, this configuration may also be readily achieved by reprogramming the equipment.

With the arrangement of the present invention, packets that would otherwise not have arrived at destination equipment 14 will successfully arrive. Advantageously, destination 14 will therefore obtain a more continuous and clear flow of the real-time media stream from source 10, and source 10 will need to re-transmit far fewer lost packets. Further, as described above, by performing channel coding at the edge of internet 12, the invention enables source 10 to compress the media stream less and therefore distort the signal less. In sum, the invention thus provides a quicker and higher quality end-to-end transmission of real-time media signals through internet 12. Additionally, the present invention will serve to speed up the transmission of pure data signals (such as e-mail messages) over a lossy network, again by reducing the need for packet retransmission and minimizing the resulting delay.

Preferred and alternative embodiments of the present invention have been illustrated and described. It will be understood, however, that changes and modifications may be made to the invention without deviating from its true spirit and scope, as defined by the following claims.

We claim:

1. In a network access server providing connectivity between a computer network and a remote terminal interconnected to said network access server via a communications link, said network access server comprising, in combination, a line interface operatively connecting said network access server to said communications link; a plurality of modems; a bus passing data signals between said line interface and said modems; and a network interface receiving data from said modems and routing said data onto said computer network and receiving data from said computer network and routing said data to said modems;

the improvement comprising:

said line interface receiving via said communications link a first data signal comprising a first set of payload transmitted from said remote terminal;

a first set of machine language instructions stored in a memory and executed by said network access server for (i) processing said first data signal and generating a first set of redundancy information indicative of said first set of payload, and (ii) generating a first coded data signal comprising said first set of payload and said first set of redundancy information; and said network interface forwarding said first coded data signal onto said computer network destined for receipt by a second remote terminal.

2. The improvement as claimed in claim 1, wherein said computer network is the Internet.

3. The improvement as claimed in claim 1, wherein said communications link comprises a computer network.

4. The improvement as claimed in claim 1, wherein said communications link comprises a telephone network.

5. The improvement as claimed in claim 1, wherein said computer network is further interconnected to a second network access server, and said improvement further comprises, in combination:

said network access server receiving from said computer network a second coded data signal comprising (i) at least part of a second set of payload transmitted onto said computer network from said second network access server and (ii) a second set of redundancy information indicative of said second set of payload;

a second set of machine language instructions stored in a memory and executed by said network access server for (a) determining whether said second coded data signal is missing a portion of said second set of payload, (b) in response to a determination that said second coded data signal is missing a portion of said second set of payload, processing said second set of redundancy information and thereby extracting said missing portion, and (c) generating an output data signal comprising payload carried by said second coded data signal; and said line interface forwarding said output data signal along said communications link to said remote terminal.

6. The improvement as claimed in claim 5, wherein said network access server establishes communication with said second network access server by sending a special packet containing a predetermined symbol.

7. The improvement as claimed in claim 6, wherein said symbol comprises a port number.

8. The improvement as claimed in claim 1, wherein generating a first set of redundancy information comprises duplicating packets of data defined by said first data signal, whereby said first coded data signal includes said packets as well as duplicates of said packets, whereby, to the extent said first coded data signal is received by said remote user device, said remote user device may disregard any duplicates of a packet that said remote user device has already received.

9. The improvement as claimed in claim 1, wherein generating a first set of redundancy information comprises applying an XOR encoder.

10. The improvement as claimed in claim 1, wherein generating said first set of redundancy information comprises applying a Reed-Solomon encoder.

11. The improvement as claimed in claim 1, wherein said first set of payload represents a real-time media signal selected from the group consisting of audio and video.

12. The improvement as claimed in claim 11, wherein said first set of payload represents a digitized voice signal.

13. The improvement as claimed in claim 11, wherein said first set of payload represents a video signal.

14. In a telecommunications system of the type including a computer network interconnected to a first link via a first network access server, said first link interconnecting a user device to said first network access server, a transmission method performed at said first network access server comprising, in combination:

receiving via said first link a first data signal comprising a first set of payload transmitted from said user device;

processing said first data signal and thereby generating a first set of redundancy information indicative of said first set of payload; and generating a first coded data signal comprising said first set of payload and said first set of redundancy information, and forwarding said first coded data signal onto said computer network destined for receipt by a remote user device.

15. A transmission method as claimed in claim 14, wherein said computer network is the Internet.

16. A transmission method as claimed in claim 14, wherein said first link comprises a computer network.

17. A transmission method as claimed in claim 14, wherein said first link comprises a telephone network.

18. A transmission method as claimed in claim 14, wherein said computer network is further interconnected to a second network access server, and said transmission method further comprises, in combination:

receiving from said computer network a second coded data signal comprising (i) at least part of a second set of payload transmitted onto said computer network from said second network access server and (ii) a second set of redundancy information indicative of said second set of payload;

determining whether said second coded data signal is missing a portion of said second set of payload and, if so, processing said second set of redundancy information and thereby extracting said missing portion; and generating an output data signal comprising payload carried by said second coded data signal, and forwarding said output data signal along said first link to said user device.

19. A transmission method as claimed in claim 18, wherein said network access server establishes communication with said second network access server by sending a special packet containing a predetermined symbol.

20. A transmission method as claimed in claim 19, wherein said symbol comprises a port number.

21. A transmission method as claimed in claim 14, wherein generating a first set of redundancy information comprises duplicating packets of data defined by said first data signal, whereby said first coded data signal includes said packets as well as duplicates of said packets, whereby, to the extent said first coded data signal is received by said remote user device, said remote user device may disregard any duplicates of a packet that said remote user device has already received.

22. A transmission method as claimed in claim 14, wherein generating a first set of redundancy information comprises applying an XOR encoder.

23. A transmission method as claimed in claim 14, wherein generating said first set of redundancy information comprises applying a Reed-Solomon encoder.

24. A transmission method as claimed in claim 14, wherein said first set of payload represents a real-time media signal selected from the group consisting of audio and video.

25. A transmission method as claimed in claim 24, wherein said first set of payload represents a digitized voice signal.

26. A transmission method as claimed in claim 24, wherein said first set of payload represents a video signal.

27. In a telecommunications system of the type including a computer network interconnected to a communications link via a network access server, said communications link interconnecting a user device to said network access server, a transmission method comprising, in combination, the following steps performed at said network access server:

receiving via said communications link a data signal comprising a set of payload transmitted from said user device;

processing said data signal and thereby generating a set of redundancy information indicative of said set of payload;

generating a coded data signal comprising said set of payload and said set of redundancy information; and forwarding said coded data signal onto said computer network destined for receipt by a remote user.

28. A transmission method as claimed in claim 27, wherein said computer network is the Internet.

29. A transmission method as claimed in claim 27, wherein said communications link comprises a computer network.

30. A transmission method as claimed in claim 27, wherein said communications link comprises a telephone network.

31. A transmission method as claimed in claim 27, wherein said computer network is further interconnected to a remote communications link via a remote network access server, and said transmission method further comprises, in combination, the following steps performed at said remote network access server:

receiving said coded data signal;

decoding said coded data signal to recover lost data packets and to thereby establish a decoded data signal; and forwarding said decoded data signal along a remote communications link to said remote user.

32. A transmission method as claimed in claim 31, wherein said remote communications link comprises a computer network.

33. A transmission method as claimed in claim 31, wherein said remote communications link comprises a telephone network.

34. A transmission method as claimed in claim 27, wherein generating said coded data signal comprises duplicating packets of data defined by said data signal, whereby said coded data signal includes said packets as well as duplicates of said packets; and and wherein said method further comprises forwarding said coded data signal to remote user equipment, whereby said remote user equipment may disregard any duplicates of a packet that said remote user equipment has already received.

35. A transmission method as claimed in claim 27, wherein generating said coded data signal comprises applying an XOR encoder to derive said set of redundancy information.

36. A transmission method as claimed in claim 27, wherein generating said coded data signal comprises applying a Reed-Solomon encoder to derive said set redundancy information.

37. A transmission method as claimed in claim 27, wherein said data represents a real-time media signal selected from the group consisting of audio and video.

38. A transmission method as claimed in claim 37, wherein said data represents a digitized voice signal.

39. A transmission method as claimed in claim 37, wherein said data represents a video signal.

40. In a telecommunications system of the type including a computer network interconnected to a first link via a first network access server and interconnected to a second link via a second network access server, said first link interconnecting a first user device to said first network access server, and said second link interconnecting a second user device to said second network access server, a transmission method performed at said first network access server comprising, in combination:

receiving via said first link a first data signal comprising a first set of payload transmitted from said first user device;

processing said first data signal and thereby generating a first set of redundancy information indicative of said first set of payload;

generating a first coded data signal comprising said first set of payload and said first set of redundancy information, and forwarding said first coded data signal onto said computer network destined for receipt by said second user device;

receiving from said computer network a second coded data signal comprising (i) at least part of a second set of payload transmitted from said second user device and (ii) a second set of redundancy information indicative of said second set of payload;

determining whether said second coded data signal is missing a portion of said second set of payload and, if so, processing said second set of redundancy information and thereby extracting said missing portion; and generating an output data signal comprising payload carried by said second coded data signal, and forwarding said output data signal to said first user device.

41. A transmission method as claimed in claim 40, wherein said first set of payload represents a real-time media signal selected from the group consisting of audio and video.

42. A transmission method as claimed in claim 41, wherein said first set of payload represents a voice signal.

43. A transmission method as claimed in claim 41, wherein said first set of payload represents a video signal.

44. In a telecommunications system of the type including a computer network interconnected to a first telephone link via a first network access server and interconnected to a second telephone link via a second network access server, said first telephone link interconnecting a first user device to said first network access server, and said second telephone link interconnecting a second user device to said second network access server, a transmission method performed at said first network access server comprising, in combination:

receiving via said first telephone link a first data set including a first set of payload transmitted from said first user device;

processing said first data set and thereby generating a first coded data set comprising (i) said first set of payload and (ii) a first set of redundancy information indicative of said first set of payload;

forwarding said first coded data set onto said computer network destined for receipt by said second user device;

receiving from said computer network a second coded data set comprising (i) at least a portion of a second set of payload transmitted from said second user device and (ii) a second set of redundancy information indicative of said second set of payload;

determining whether said second coded data set is missing a portion of said second set of payload;

in response to said second coded data set missing a portion of said second set of payload, processing said second set of redundancy information and thereby extracting said missing portion; and generating an output data set comprising payload carried by said second coded data set, and forwarding said output data to said first user device.

45. A transmission method as claimed in claim 44, wherein said first set of payload represents a real-time media signal selected from the group consisting of audio and video.

46. In a telecommunications system of the type including a computer network interconnected to a first communications link via a first network access server and interconnected to a second communications link via a second network access server, said first communications link interconnecting a first user device to said first network access server, and said second communications link interconnecting a second user device to said second network access server, a transmission method comprising, in combination:

receiving a first data set including a first set of payload transmitted from said first user device;

processing said first data set and thereby generating a first coded data set comprising (i) said first set of payload and (ii) a first set of redundancy information of said first set of payload; and forwarding said first coded data set onto said computer network destined for receipt by said second user device.

47. A transmission method as claimed in claim 46, further comprising, in combination:

receiving from said computer network a second coded data set comprising (i) at least a portion of a second set of payload transmitted from said second user device and (ii) a second set of redundancy information of said second set of payload;

determining whether said second coded data set is missing a portion of said second set of payload;

in response to said second coded data set missing a portion of said second set of payload, processing said second set of redundancy information and thereby extracting said missing portion; and generating an output data set comprising payload carried by said second coded data set, and forwarding said output data to said first user device.

48. In a telecommunications system of the type including a computer network interconnected to a communications link via a network access server, said communications link carrying data from a local user device to said network access server for transmission within said computer network, a method comprising, in order:

source coding said data at said local user device and thereby establishing a source coded data stream;

sending said source coded data stream over said communications link; and channel coding said source coded data stream at said network access server, and thereby establishing a channel coded data stream.

49. A method as claimed in claim 48, further comprising, in combination:

channel decoding said channel coded data stream in a remote network access server, and thereby recovering said at least a portion of said source coded data stream; and forwarding said at least a portion of said source coded data stream to remote user equipment.

50. A method as claimed in claim 49, wherein:

channel coding said source coded data stream comprises appending to said source coded data stream a forward error correction code; and channel decoding said channel coded data stream comprises extracting a missing portion of said data from information including said forward error correction code.

51. A method as claimed in claim 49, wherein channel coding said source coded data stream comprises appending to said source coded data stream duplicates of data packets defined by said source coded data stream.

52. A method as claimed in claim 48, wherein channel coding said source coded data stream comprises duplicating packets of data defined by said source coded data stream, whereby said channel coded data stream includes said packets as well as duplicates of said packets; and and wherein said method further comprises forwarding said channel coded data stream to remote user equipment, whereby said remote user equipment may disregard any duplicates of a packet that said remote user equipment has already received.

53. A method as claimed in claim 48, wherein channel coding said source coded data stream comprises applying an XOR encoder to derive redundancy information.

54. A method as claimed in claim 48, wherein channel coding said source coded data stream comprises applying a Reed-Solomon encoder to derive redundancy information.

55. A method as claimed in claim 48, wherein said data represents a real-time media signal selected from the group consisting of audio and video.

56. A method as claimed in claim 55, wherein said data represents a digitized voice signal.

57. A method as claimed in claim 55, wherein said data represents a video signal.

* * * * *